(12) United States Patent
Lin et al.

(10) Patent No.: US 10,788,709 B2
(45) Date of Patent: Sep. 29, 2020

(54) LIGHTING DEVICE

(71) Applicant: InnoLux Corporation, Miao-Li County (TW)

(72) Inventors: Hsiao-Lang Lin, Miao-Li County (TW); Tsung-Han Tsai, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 16/174,297

(22) Filed: Oct. 30, 2018

(65) Prior Publication Data

US 2020/0133077 A1 Apr. 30, 2020

(51) Int. Cl.
*H01L 27/32* (2006.01)
*H01L 25/075* (2006.01)
*H01L 33/06* (2010.01)
*G02F 1/13357* (2006.01)
*G02F 1/1335* (2006.01)
*F21V 8/00* (2006.01)

(52) U.S. Cl.
CPC ....... *G02F 1/133617* (2013.01); *G02B 6/005* (2013.01); *G02F 1/133512* (2013.01); *G02F 1/133609* (2013.01); *H01L 27/322* (2013.01)

(58) Field of Classification Search
USPC ........................................................ 257/89
See application file for complete search history.

(56) References Cited

U.S. PATENT DOCUMENTS

| | | | |
|---|---|---|---|
| 7,868,321 B2 | 1/2011 | Lee | |
| 8,044,577 B2 | 10/2011 | Hwang | |
| 8,102,118 B2 | 1/2012 | Lee | |
| 2004/0135504 A1* | 7/2004 | Tamaki | C01B 21/0602 313/512 |
| 2011/0164203 A1* | 7/2011 | Kimura | G02B 6/0003 349/62 |
| 2013/0300280 A1* | 11/2013 | Toda | H01L 33/504 313/498 |
| 2015/0049459 A1* | 2/2015 | Peeters | H01L 25/0753 362/84 |
| 2017/0047488 A1* | 2/2017 | Kaneko | H01L 33/504 |
| 2017/0111972 A1* | 4/2017 | Oepts | H05B 33/0857 |
| 2017/0236866 A1* | 8/2017 | Lee | H01L 27/156 257/89 |
| 2018/0246356 A1* | 8/2018 | Lin | G02F 1/133528 |
| 2018/0247979 A1* | 8/2018 | Lin | H01L 25/0753 |
| 2018/0284501 A1* | 10/2018 | Lin | G09G 3/20 |
| 2018/0348574 A1* | 12/2018 | Lin | G02F 1/133617 |
| 2018/0351039 A1* | 12/2018 | Kim | H01L 33/08 |
| 2019/0041698 A1* | 2/2019 | Lin | G06F 3/0481 |
| 2019/0088833 A1* | 3/2019 | Itoga | C09K 11/0883 |
| 2019/0097098 A1* | 3/2019 | Fujio | H01L 33/507 |
| 2019/0294003 A1* | 9/2019 | Lin | G02F 1/133609 |

* cited by examiner

*Primary Examiner* — Fazli Erdem
(74) *Attorney, Agent, or Firm* — Winston Hsu

(57) ABSTRACT

A lighting device includes a first lighting unit and a second lighting unit. The first lighting unit emits a first light spectrum having a main peak between 525 nm and 585 nm and a first sub peak between 400 nm and 470 nm. The second lighting unit emits a second light spectrum having a main peak between 595 nm and 775 nm and a second sub peak between 400 nm and 470 nm. An intensity of the first sub peak is different from an intensity of the second sub peak.

19 Claims, 7 Drawing Sheets

LIGHTING DEVICE

BACKGROUND OF THE DISCLOSURE

1. Field of the Disclosure

The present disclosure relates to a lighting device, and more particularly to a lighting device including the light converting element.

2. Description of the Prior Art

In the conventional lighting devices, the green light and the red light are usually used for color mixing to produce the light having a color (e.g. yellow light). However, the color of the light (e.g. yellow light) may be bluish in the photopic vision condition of the conventional lighting devices for the observer. Therefore, the present disclosure proposes a lighting device that can reduce the above problems.

SUMMARY OF THE DISCLOSURE

In some embodiments, a lighting device includes a lighting unit emitting a light spectrum having a main peak between 520 nm and 780 nm and a sub peak between 400 nm and 470 nm. A second sub peak integral of the light spectrum is greater than a first sub peak integral of the light spectrum.

In some embodiments, a lighting device includes a first lighting unit and a second lighting unit. The first lighting unit emits a first light spectrum having a main peak between 525 nm and 585 nm and a first sub peak between 400 nm and 470 nm. The second lighting unit emits a second light spectrum having a main peak between 595 nm and 775 nm and a second sub peak between 400 nm and 470 nm. An intensity of the first sub peak is different from an intensity of the second sub peak.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. For purposes of illustrative clarity understood, various drawings of this disclosure show a portion of the electronic device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to".

When an element or layer is referred to as being "on" or "connected to" another element or layer, it can be directly on or directly connected to the other element or layer, or intervening elements or layers may be presented. In contrast, when an element is referred to as being "directly on" or "directly connected to" another element or layer, there are no intervening elements or layers presented.

The terms "about", "substantially", "equal", or "same" generally mean within 20% of a given value or range, or mean within 10%, 5%, 3%, 2%, 1%, or 0.5% of a given value or range.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

The technical features in different embodiments described in the following can be replaced, recombined, or mixed with one another to constitute another embodiment without departing from the spirit of the present disclosure.

Figure 1:
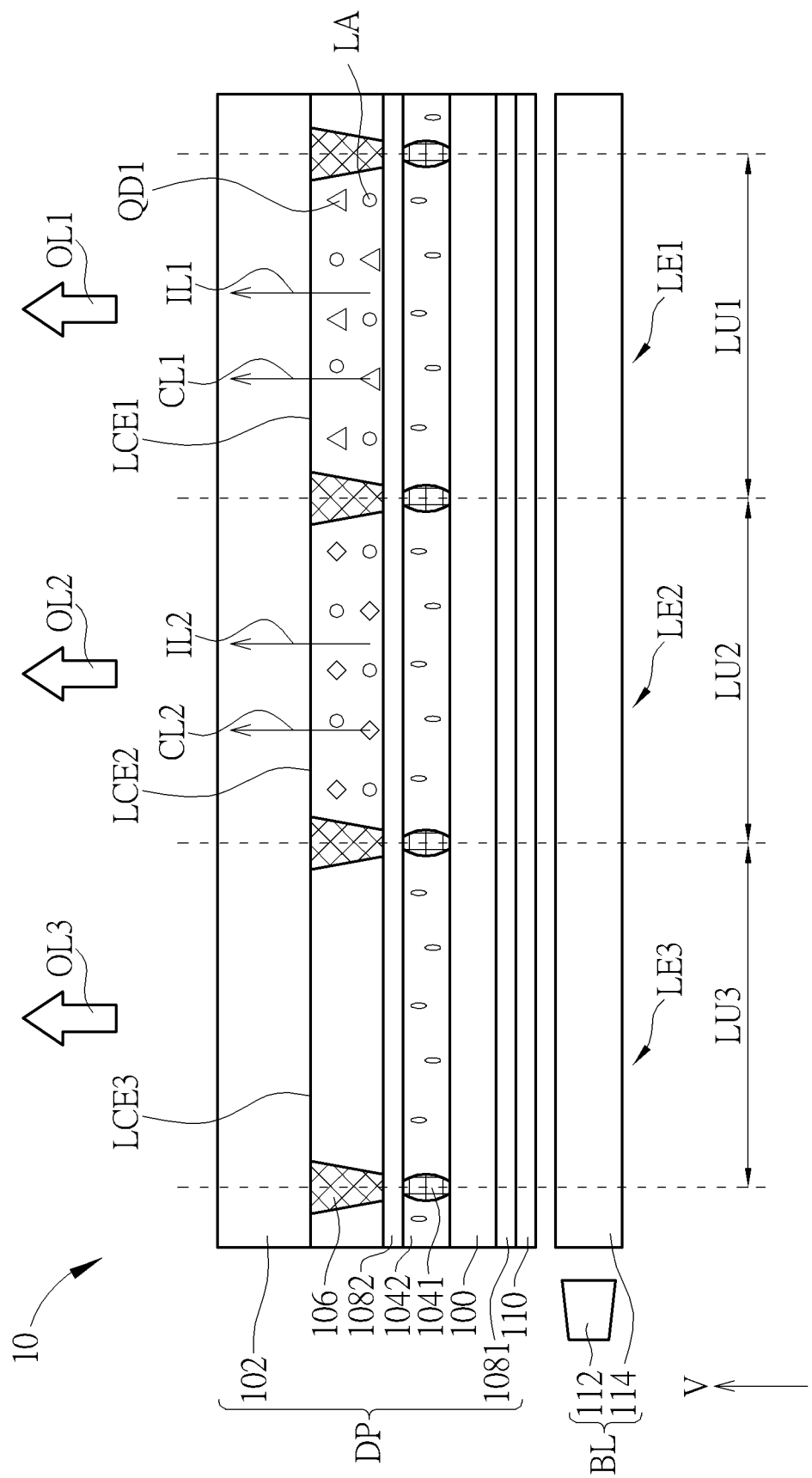
FIG. 1 is a schematic diagram illustrating a cross-sectional view of a lighting device according to a first embodiment of the present disclosure.

Referring to FIG. 1, it is a schematic diagram illustrating a cross-sectional view of a lighting device according to a first embodiment of the present disclosure. The lighting device may include a display device, an electronic device, a flexible device, or other suitable devices, but is not limited thereto. In some embodiments, the lighting device can be applied to a tiled device. For example, the lighting device 10 is a display device, which may include a panel DP and a backlight module BL, and the panel DP is disposed opposite to the backlight module BL. The panel DP may include a first substrate 100, a second substrate 102, and a light modulating layer 1042 disposed between the first substrate 100 and the second substrate 102. The first substrate 100 may be disposed between the light modulating layer 1042 and the backlight module BL. The first substrate 100 and/or the second substrate 102 may include transparent substrates, for example, a rigid substrate includes a glass substrate or a quartz substrate, or a flexible substrate includes a plastic substrate, but not limited thereto. The material of the plastic substrate may include polyimide (PI), polycarbonate (PC), or polyethylene terephthalate (PET), but not limited thereto.

In one embodiment, the lighting device includes a liquid crystal panel, and the light modulating layer 1042 may be a liquid crystal layer, and some spacers 1041 may be disposed between the first substrate 100 and the second substrate 102. Additionally, the panel DP may also include alignment layers (e.g. PI layers) or electrodes (e.g. pixel electrodes or common electrodes), a shielding structure 106, but not limited thereto. The first substrate 100 may be an array substrate. The second substrate 102 may be a color filter substrate or protective substrate, but not limited thereto. For example, transistors, signal lines, scan lines, data lines, or insulating layers may be disposed on the first substrate 100, but is not limited thereto. For example, the shielding structure 106 may be disposed between the second substrate 102 and the first substrate 100. The shielding structure 106 may include a plurality of apertures, and each of the light converting elements (such as the light converting element LCE1, LCE2, or LCE3) may be disposed in the corresponding aperture of the shielding structure 106. The material of the shielding structure 106 may include black photoresist, black printing ink, black resin or other suitable material or combination thereof, but not limited thereto.

The panel DP may further include a polarizer 1081 and a polarizer 1082. The polarizer 1081 may be disposed between the first substrate 100 and the backlight module BL, and the polarizer 1082 may be disposed between the light converting elements (such as the light converting element LCE1, LCE2, or LCE3) and the light modulating layer 1042. However, polarizer 1081 and polarizer 1082 are not limited to be disposed at the above mentioned locations. It should be noted that, in some embodiments, the lighting device has the light modulating layer 1042 (such as LC), the light modulating layer 1042 may be disposed between two polarizers for adjusting gray scale, so the light converting elements cannot be disposed between two polarizers. In some embodiments, the polarizer 1081 and/or the polarizer 1082 are disposed between the first substrate 100 and the second substrate 102, the polarizer 1081 and/or the polarizer 1082 may include metal wires, which can be the so-called wire grid polarizer (WGP), but is not limited thereto. The material of metal wire includes metal, metal alloy, other suitable material or combination thereof, but is not limited thereto. In some embodiments, the first substrate 100 and the second substrate 102 may be disposed between the polarizer 1081 and the polarizer 1082, the material of polarizer 1081 and the polarizer 1082 may include protective film, tri-acetate cellulose (TAC), polyvinyl alcohol (PVA), pressure sensitive adhesive (PSA), release film, but is not limited thereto. In addition, the panel DP may further include at least one optical film 110 disposed between the panel DP and the backlight module BL. In some embodiments, the optical film 110 includes dual brightness enhancement film (DBEF), prism film, other suitable optical films, or combination thereof, but not limited thereto.

The backlight module BL may include a light source 112 and a light guide plate 114. As shown in FIG. 1, the backlight module BL may be an edge-lit type backlight module, and the light source 112 may be disposed near at least one sidewall of the light guide plate 114, but not limited thereto. The light source 112 may include light emitting diode (LED), micro-LED, mini-LED, organic light-emitting diode (OLED), fluorescent material, phosphor, other suitable light sources, or combination thereof, but not limited thereto. In one embodiment, the backlight module BL can emit blue light or UV light, but not limited thereto.

As shown in FIG. 1, the lighting device 10 can include a first lighting unit LU1, a second lighting unit LU2, and a third lighting unit LU3. The first lighting unit LU1 includes a first light emitting element LE1 and a first light converting element LCE1, the second lighting unit LU2 includes a second light emitting element LE2 and a second light converting element LCE2, and the third lighting unit LU3 includes a third light emitting element LE3 and a third light converting element LCE3. One of the lighting units may correspond to a structure including a vertical stack of layers (or elements) of a portion of the lighting device 10. For example, one of the lighting units may be a portion of the lighting device 10 emitting one color (e.g. red, green, or blue, but not limited thereto). One of the lighting units may correspond to one of the apertures of the shielding structure 106. In one of the lighting units, the light converting element can be disposed on the light emitting element. For example, the first light converting element LCE1 is disposed on the first light emitting element LE1, the second light converting element LCE2 is disposed on the second light emitting element LE2, and the third light converting element LCE3 is disposed on the third light emitting element LE3. Additionally, the light modulating layer 1042 can be disposed between the light emitting elements and the light converting elements.

A portion of the backlight module BL (such as the light guide plate 114) in FIG. 1 corresponding to the first light converting element LCE1 in a normal direction V may be regarded as the first light emitting element LE1, a portion of the backlight module BL corresponding to the second light converting element LCE2 in the normal direction V may be regarded as the second light emitting element LE2, and a portion of the backlight module BL corresponding to the third light converting element LCE3 in the normal direction V may be regarded as the third light emitting element LE3. The normal direction V is perpendicular to the first substrate 100.

The first light converting element LCE1, the second light converting element LCE2, or the third light converting element LCE3 may include quantum dots, fluorescent materials, phosphorescent materials, color filter layer, other suitable materials or the combination thereof, but not limited thereto. The quantum dots may be made of a semiconductor nano-crystal structure, and can include CdSe, CdS, CdTe, ZnSe, ZnTe, ZnS, HgTe, InAs, Cd1-xZnxSe1-ySy, CdSe/ZnS, InP, and GaAs, but not limited thereto. Quantum dots generally have a particle size between 1 nanometer (nm) and 30 nm, 1 nm and 20 nm, or 1 nm and 10 nm. In one embodiment, quantum dots are excited by an input light emitted by the backlight module BL, the input light will be converted into an emitted light with different wavelength by quantum dots. The color of the emitted light may be adjusted by the material or size of the quantum dots. In other embodiments, the quantum dots may include sphere particles, rod particles or particles with any other suitable shapes as long as the quantum dots could emit light with suitable color.

As shown in FIG. 1, the first light converting element LCE1 may include quantum dots QD1, the quantum dots QD1 can be excited by a portion of the input light IL1, and the portion of the input light IL1 may be converted into a light CL1 by the quantum dots QD1. Since the conversion efficiency of quantum dots may not be 100%, another portion of the input light IL1 may not be converted into the light CL1, and a first light OL1 may be the mixture of the light CL1 and the unconverted input light IL1. The first light OL1 may be an output light emitted from the first lighting unit LU1. In this disclosure, the output light could be regarded as the final visual light of the lighting device 10 perceived by the observer.

As shown in FIG. 1, the second light converting element LCE2 may include quantum dots QD2, the quantum dots QD2 can be excited by a portion of the input light IL2, and the portion of the input light IL2 may be converted into a light CL2 by the quantum dots QD2. The quantum dots QD2 may be different from the quantum dots QD1. A second light OL2 may be the mixture of the light CL2 and the unconverted input light IL2. The second light OL2 may be an output light emitted from the second lighting unit LU2.

In one embodiment, a third light OL3 emitted by the third lighting unit LU3 can be blue light. Since the third light emitting element LE3 emits blue light, the third light converting element LCE3 may be replaced by a transparent layer, which has no quantum dots therein. The transparent layer may include transparent dielectric material, but not limited thereto. In some embodiments, the third light converting element LCE3 may include a blue color filter. In some embodiment, the third light converting element LCE3 is not included in the third electronic unit EU3. In some embodiments, the third light converting element LCE3 may include suitable type of quantum dots to adjust the wavelength of the third light OL3.

In some embodiments, a plurality of light absorbing materials LA may be disposed in the first light converting element LCE1 and/or the second light converting element LCE2. In some embodiments, the light absorbing materials LA may be disposed on the first light converting element LCE1 and/or the second light converting element LCE2, for example, the light absorbing materials LA may be mixed in a suitable layer(s) above the first light converting element LCE1 and/or the second light converting element LCE2. The light absorbing material LA can be used for absorbing a portion of the unconverted input light IL1 (and/or a portion of the unconverted input light IL2), so the amount of the unconverted input light IL1 (and/or input light IL2) can be reduced. The light absorbing materials LA may include benzotriazole ($C_6H_5N_3$), titanium oxide ($TiO_2$), zirconium oxide ($ZrO_2$), other suitable materials or the combination thereof, but not limited thereto. $C_6H_5N_3$, $TiO_2$, or $ZrO_2$ can absorb the light having the wavelength less than 450 nm or less than 400 nm, but not limited thereto.

For example, the content ratio of $C_6H_5N_3$ in the light absorbing material LA may be in a range from 0.1% to 20.2% (0.1%≤content ratio≤20.2%), and the content ratio of $TiO_2$ in the light absorbing material LA may be in a range from 0.2% to 19.6% (0.2%≤content ratio≤19.6%). In this situation, the transmittance of the light absorbing material LA corresponding to the light having the wavelength of 450 nm may be in a range from 86.5% to 91.2% (86.5%≤transmittance≤91.2%), the transmittance of the light absorbing material LA corresponding to the light having the wavelength of 400 nm may be in a range from 1.66% to 11.8% (1.66%≤transmittance≤11.8%), and the transmittance of the light absorbing material LA corresponding to the light having the wavelength of 380 nm may be in a range from 0.0005% to 0.005% (0.0005%≤transmittance 0.001%≤0.005%). The content ratio of different materials can be adjusted according to the requirement.

In addition, the light absorbing material LA may include yellow pigment (Y-pigment), yellow dye (Y-dye), YAG phosphor, other suitable materials or the combination thereof, but not limited thereto. Y-pigment may include $C_{16}H_{12}Cl_2N_4O_4$, Y 184, Y 185, Y 189, Y 194, Y 213, Y 120, Y 128, Y 138, Y 139, Y 150, or Y 151. Y-dye may include $C_{26}H_{18}N_4Na_2O_8S_2$. YAG phosphor may include YAG:$Ce^{3+}$, $Y_3Al_5O_{12}$:$Ce^{3+}$, or other commercial YAG phosphors, but not limited thereto.

Figure 2:
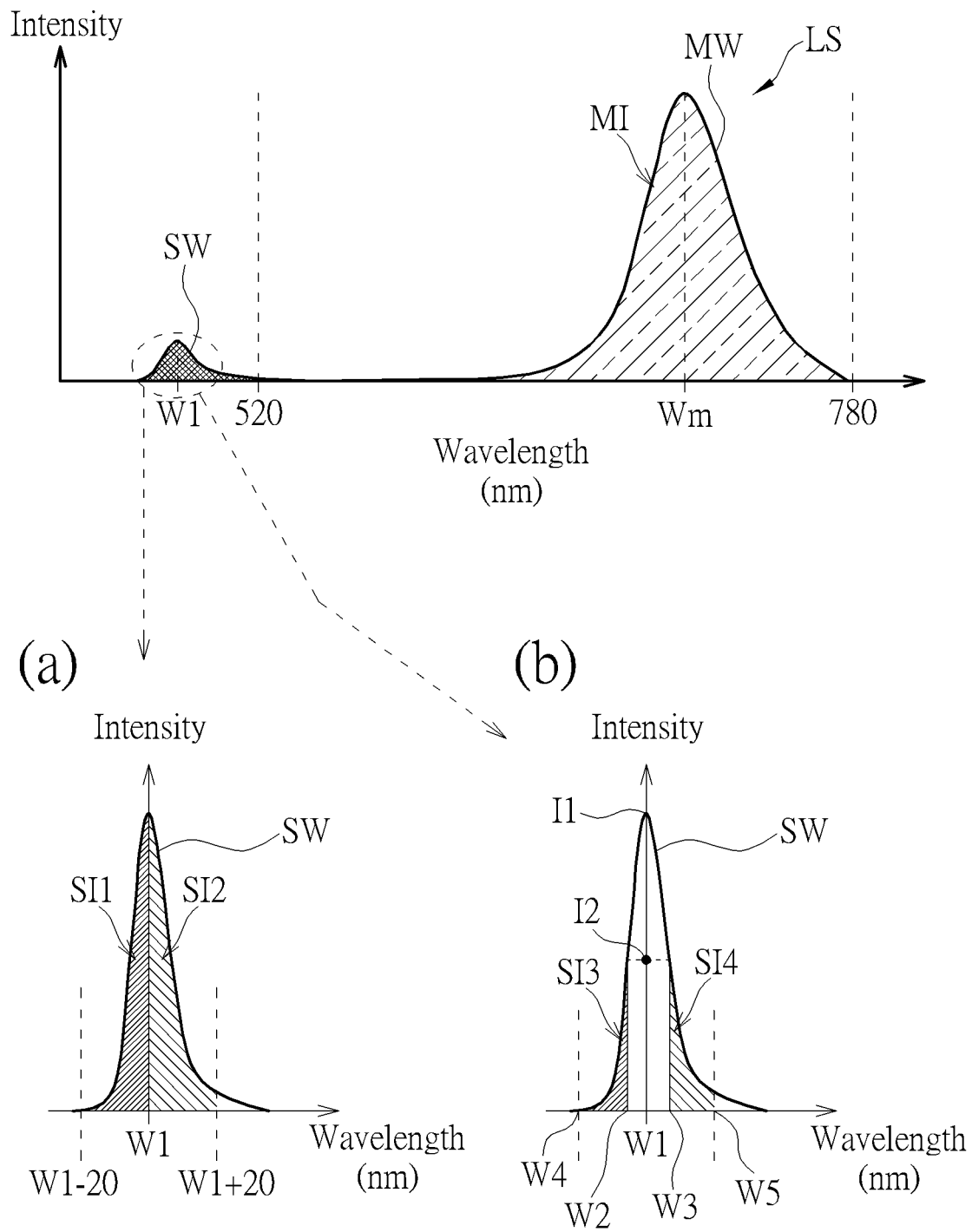
FIG. 2 is a schematic diagram illustrating the light spectrum of the output light emitted by the first lighting unit or the second lighting unit according to the first embodiment.

Referring to FIG. 2, it is a schematic diagram illustrating the light spectrum of the output light emitted by the first lighting unit or the second lighting unit. The light spectrums of the first light OL1 and the second light OL2 may have similar features or characteristics. The features or characteristics of the light spectrum LS described below may be applied to the first lighting unit LU1 and the second lighting unit LU2.

In FIG. 2, the light spectrum LS may include a main wave MW and a sub-wave SW. The main wave MW may represent the light CL1 (or the light CL2) converted by the first light converting element LCE1 (or the second light converting element LCE2). A main peak of the main wave MW corresponds to a wavelength Wm, and the wavelength Wm may be in a range from 520 nm to 780 nm. "Main peak of the main wave MW" is defined as a crest of the main wave MW1. "Main peak of the main wave" in other light spectrums may also be defined by the same way described above. In addition, a portion of the input light may be converted by the first light converting element LCE1 (or the second light converting element LCE2), the intensity of the main peak of the main wave MW is greater than the intensity of the sub peak of the sub-wave SW.

The sub-wave SW may represent the unconverted input light IL1 in the first light OL1 (or the unconverted input light IL2 in the second light OL2). It is noteworthy that the sub-wave SW corresponds to the unconverted input light. A sub peak of the sub-wave SW corresponds to a wavelength W1 in the range from 400 nm to 470 nm, thus the sub-wave SW may correspond to blue light. "Sub peak of the sub-wave SW" is defined as a crest of the sub-wave SW. "Sub peak of sub-wave" in other light spectrums may also be defined by the same way described above. In some embodiments, the light absorbing material LA may have higher absorbance corresponding to the light with shorter wavelength (such as less than or equal to 400 nm, but not limited thereto), so the waveform of the sub-wave SW may be asymmetric. As shown in the enlargement (a) of the sub-wave SW in FIG. 2, a first sub peak integral SI1 of the light spectrum LS is the intensity integral of a portion of the waveform of the sub-wave SW. The first sub peak integral SI1 is calculated from the wavelength of the wavelength W1 minus 20 nm (W1 (nm)−20 (nm)) to the wavelength W1. In addition, a second sub peak integral SI2 of the light spectrum LS is the intensity integral of another portion of the waveform of the sub-wave SW. The second sub peak integral SI2 is calculated from the wavelength W1 to the wavelength of the wavelength W1 plus 20 nm (W1 (nm)+20 (nm)). Since the waveform of the sub-wave SW may be asymmetric, the second sub peak integral SI2 is different from the first sub peak integral SI1, and the second sub peak integral SI2 is greater than the first sub peak integral SI1. A ratio of the first sub peak integral SI1 to the second sub peak integral SI2 (SI1/SI2) can be in a range from 20% to 98% (20%≤SI1/SI2≤98%).

In addition, an intensity integral MI of the main wave MW can be calculated from 521 nm to 780 nm. A ratio of the first sub peak integral SI1 to the intensity integral MI of the main wave MW can be in a range from 0.05% to 2% (0.05%≤SI1/MI≤2%), and a ratio of the second intensity integral SI2 to the intensity integral MI of the main wave MW (SI2/MI) can be in a range from 0.05% to 10% (0.05%≤SI2/MI≤10%).

As shown in the enlargement (b) of the sub-wave SW in FIG. 2, the sub peak of the sub-wave SW corresponds to an intensity I1, a wavelength W2 and a wavelength W3 respectively correspond to an intensity I2 of a half of the intensity I1, and the wavelength W2 is less than the wavelength W3. An intensity integral of the sub-wave SW of the light spectrum LS calculated from a wavelength W4 to the wavelength W2 is defined as a third sub peak integral SI3, and the wavelength W4 is equal to the wavelength W2 minus 20 nm (W4 (nm)=W2 (nm)−20 (nm)). Another intensity integral of the sub-wave SW of the light spectrum LS calculated from the wavelength W3 to a wavelength W5 is defined as a fourth sub peak integral SI4, and the wavelength W5 is equal to the wavelength W3 plus 20 nm (W5 (nm)=W3 (nm)+20 (nm)). The third sub peak integral SI3 is different from the fourth sub peak integral SI4, and a ratio of the third sub peak integral SI3 to the fourth sub peak integral SI4 (SI3/SI4) can be in a range from 4% to 30% (4%≤SI3/SI4≤30%).

Figure 3:
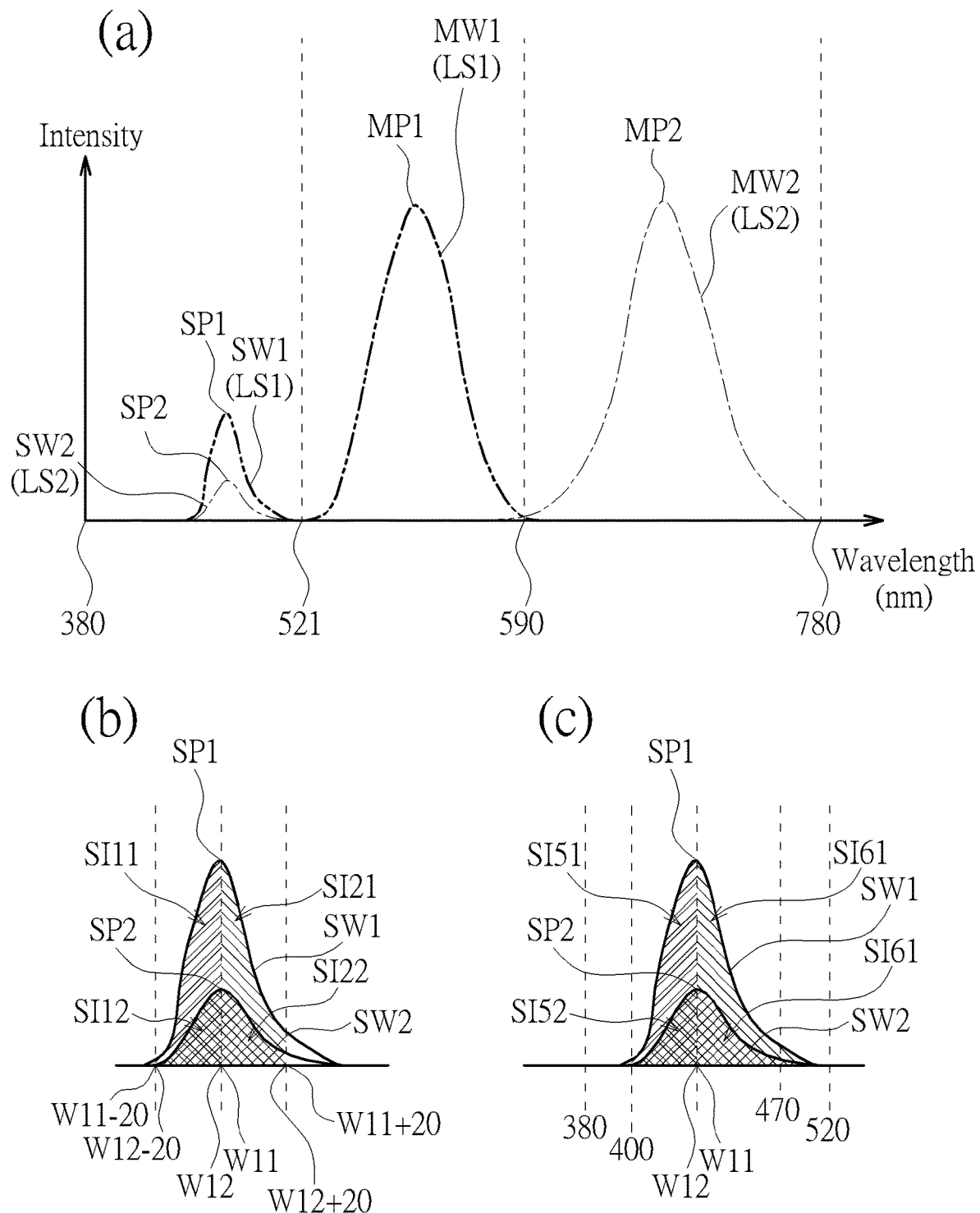
FIG. 3 is a schematic diagram illustrating the light spectrums of the output lights emitted by the first lighting unit and the second lighting unit according to the first embodiment.

Referring to FIG. 3, it is a schematic diagram illustrating the light spectrums of the output lights emitted by the first lighting unit and the second lighting unit according to the first embodiment. In the spectrum diagram (a) of FIG. 3, the first light OL1 emitted by the first lighting unit LU1 has a first light spectrum LS1 including a main wave MW1 and a sub-wave SW1, and the second light OL2 emitted by the second lighting unit LU2 has a second light spectrum LS2 including a main wave MW2 and a sub-wave SW2. The main wave MW1 and the main wave MW2 respectively correspond to the light CL1 and the light CL2 in FIG. 1, the main wave MW1 can have a main peak MP1 between 525 nm and 585 nm, and the main wave MW2 can have a main peak MP2 between 595 nm and 775 nm as shown in the spectrum diagram (a) of FIG. 3. The sub-wave SW1 and the sub-wave SW2 respectively correspond to the unconverted input light IL1 and the unconverted input light IL2 in FIG. 1. As shown in the spectrum diagram (a) of FIG. 3, the sub-wave SW1 can have a first sub peak SP1 between 400 nm and 470 nm, and the sub wave SW2 can have a second sub peak SP2 between 400 nm and 470 nm. The intensity of the first sub peak SP1 can be different from the intensity of the second sub peak SP2. For example, the intensity of the first sub peak SP1 may be greater than the intensity of the second sub peak SP2, but not limited thereto. In some embodiments, the integral area of the first light spectrum LS1 may partially overlaps the integral area of the second light spectrum LS2. For example, the integral area of the sub wave SW2 of second light spectrum LS2 may be overlapped with the integral area of the sub wave SW1 of first light spectrum LS1, which means that the integral area of the first light spectrum LS1 may partially overlaps the integral area of the second light spectrum LS2, but not limited thereto.

As shown in the enlargement (b) of the sub-wave SW1 and the sub-wave SW2 in FIG. 3, similar to the description above, the sub-wave SW1 in the first light spectrum LS1 can have a first sub peak integral SI11 and a second sub peak integral SI21, and the sub-wave SW2 in the second light spectrum LS2 can have a first sub peak integral SI12 and a second sub peak integral SI22. The first sub peak SP1 of the first light spectrum LS1 corresponds to a wavelength W11, the second sub peak SP2 of the second light spectrum LS2 corresponds to a wavelength W12, and the wavelength W11 and the wavelength W12 may be the same in FIG. 3, but not limited thereto. In some embodiments, the wavelength W11 and the wavelength W12 may be different. The first sub peak integral SI11 is calculated from the wavelength of the wavelength W11 minus 20 nm (W11 (nm)−20 (nm)) to the wavelength W11, and the second sub peak integral SI21 is calculated from the wavelength W11 to the wavelength of the wavelength W11 plus 20 nm (W11 (nm)+20 (nm)). For example, the first sub peak integral SI11 may be calculated by $SI11=\int_{\lambda=W11-20}^{\lambda=W11} I(\lambda)d\lambda$, the second sub peak integral SI21 may be calculated by $SI21=\int_{\lambda=W11}^{\lambda=W11+20} I(\lambda)d\lambda$, wherein I is the intensity of the sub-wave SW1 and λ is the wavelength. The first sub peak integral SI12 is calculated from the wavelength of the wavelength W12 minus 20 nm (W12 (nm)−20 (nm)) to the wavelength W12, and the second sub peak integral SI22 is calculated from the wavelength W12 to the wavelength of the wavelength W12 plus 20 nm (W12 (nm)+20 (nm)). For example, the first sub peak integral SI12 may be calculated by $SI12=\int_{\lambda=W12-20}^{\lambda=W12} I(\lambda)d\lambda$, the second sub peak integral SI22 may be calculated by $SI22=\int_{\lambda=W12}^{\lambda=W12+20} I(\lambda)d\lambda$, wherein I is the intensity of the sub-wave SW2 and λ is the wavelength. In some embodiments, a ratio of the first sub peak integral SI11 to the second sub peak integral SI21 (SI11/SI21) of the first light spectrum LS1 is different from a ratio of the first sub peak integral SI12 to the second sub peak integral SI22 (SI12/SI22) of the second light spectrum LS2.

As shown in the enlargement (c) of the sub-wave SW1 and the sub-wave SW2 in FIG. 3, a fifth sub peak integral SI51 of the sub-wave SW1 of the first light spectrum LS1 can be calculated from 380 nm to the wavelength W11 of the first sub peak SP1, and a sixth sub peak integral SI61 of the sub-wave SW1 of the first light spectrum LS1 can be calculated from the wavelength W11 of the first sub peak SP1 to 520 nm. For example, the fifth sub peak integral SI51 may be calculated by $SI51=\int_{\lambda=380\ nm}^{\lambda=W11} I(\lambda)d\lambda$, the sixth sub peak integral SI61 may be calculated by $SI61=\int_{\lambda=W11}^{\lambda=520\ nm} I(\lambda)d\lambda$, wherein I is the intensity of the sub-wave SW1 and λ is the wavelength. In addition, a fifth sub peak integral SI52 of the sub-wave SW2 of the second light spectrum LS2 can be calculated from 380 nm to the wavelength W12 of the second sub peak SP2, and a sixth sub peak integral SI62 of the sub-wave SW2 of the second light spectrum LS2 can be calculated from the wavelength W12 of the second sub peak SP2 to 520 nm. For example, the fifth sub peak integral SI52 may be calculated by $SI52=\int_{\lambda=380\ nm}^{\lambda=W12} I(\lambda)d\lambda$, the sixth sub peak integral SI62 may be calculated by $SI62=\int_{\lambda=W12}^{\lambda=520\ nm} I(\lambda)d\lambda$, wherein I is the intensity of the sub-wave SW2 and λ is the wavelength. In some embodiments, a ratio of the fifth sub peak integral SI51 to the sixth sub peak integral SI61 (SI51/SI61) is different from a ratio of the fifth sub peak integral SI52 to the sixth sub peak integral SI62 (SI52/SI62).

In some embodiments, the first light OL1 can be green light, the second light OL2 can be red light, and the third light OL3 can be blue light, but not limited thereto. In some embodiments, the lighting device 10 may include other lighting units emitting a light with a color different from the first light OL1, the second light OL2 and the third light OL3. In some embodiments, the lighting device 10 may include other lighting units emitting a light with different wavelength.

Figure 4:
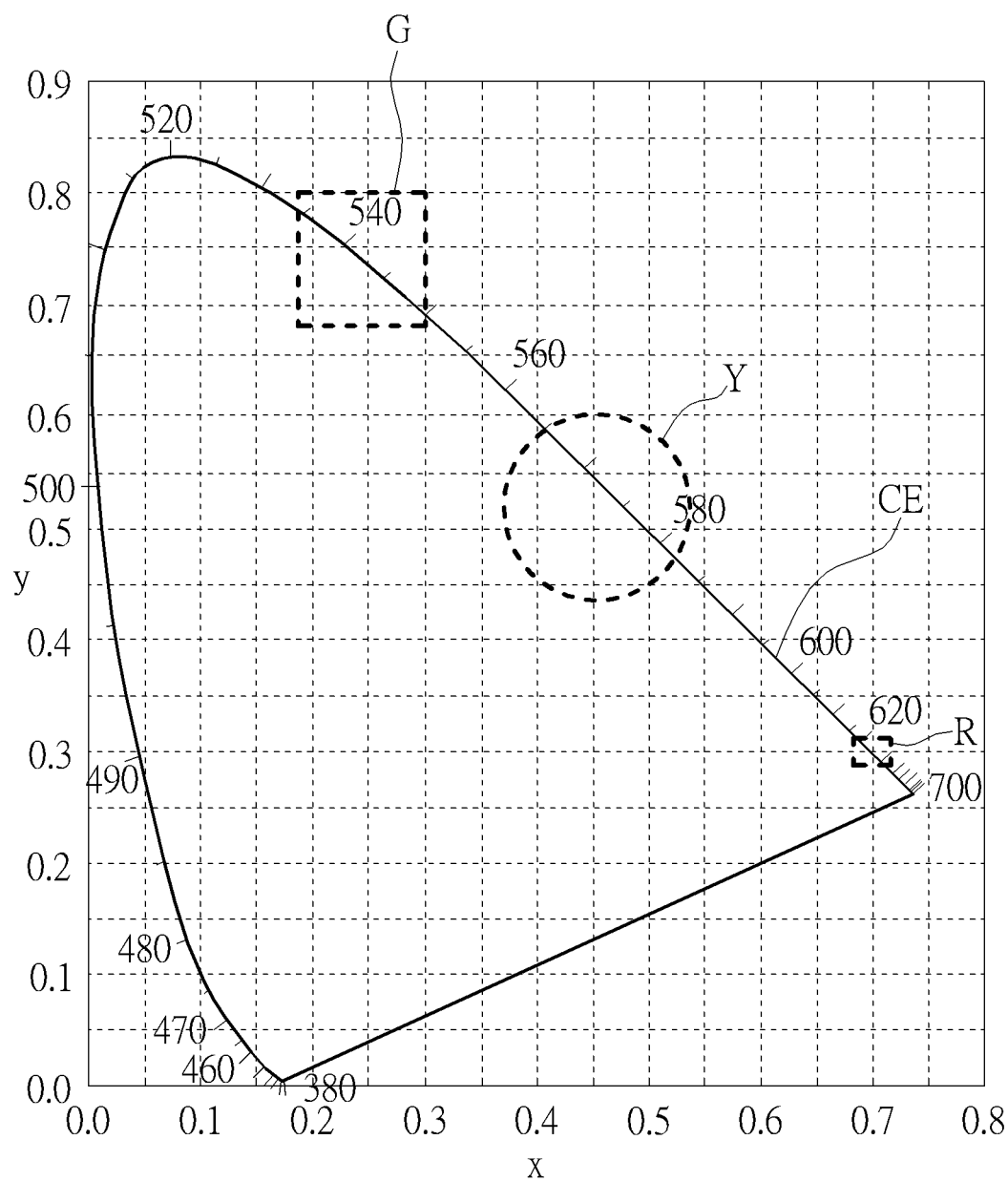
FIG. 4 is a CIE 1931 chromaticity diagram.
Figure 5:
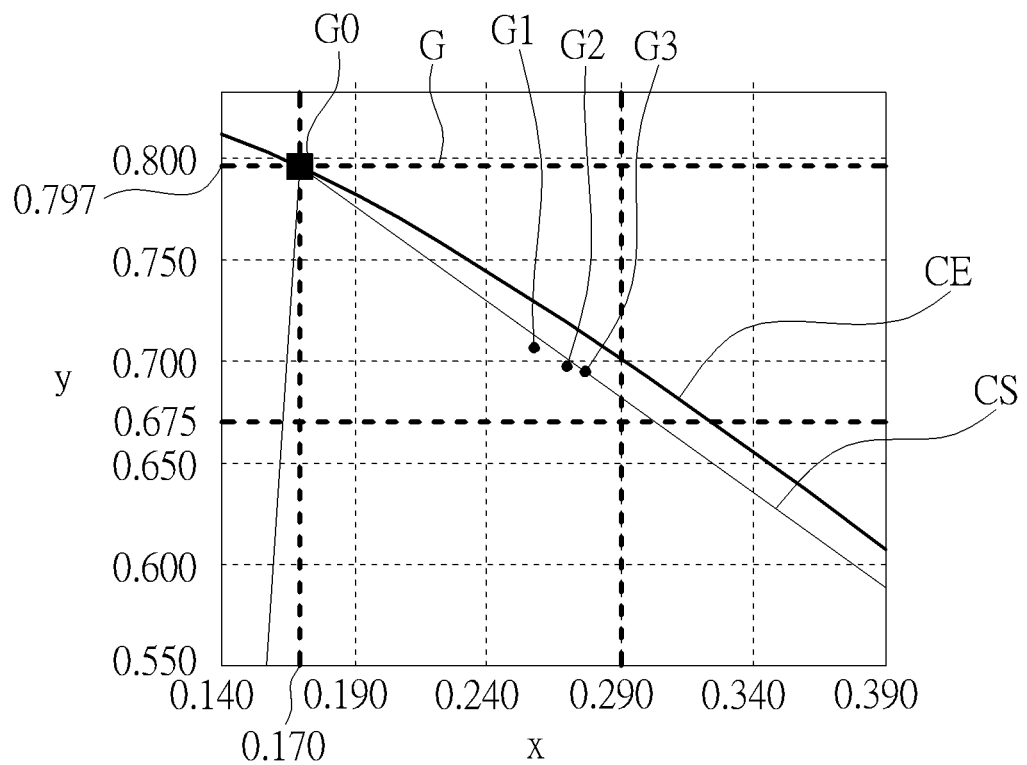
FIG. 5 is a schematic diagram illustrating the enlargement of the region G in FIG. 4 with points of different output lights of the first lighting units.
Figure 6:
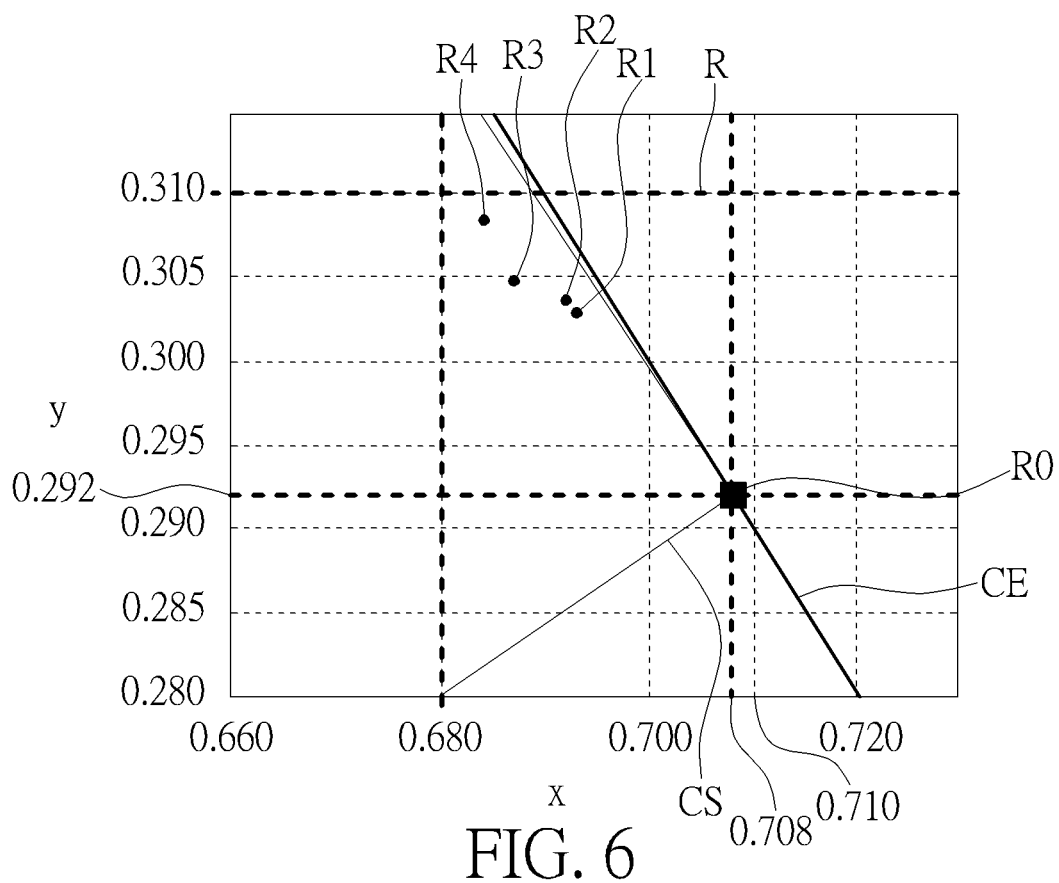
FIG. 6 is a schematic diagram illustrating the enlargement of the region R in FIG. 4 with points of different output lights of the second lighting units.

Referring to FIG. 4 to FIG. 6, FIG. 4 is a CIE 1931 chromaticity diagram, FIG. 5 is a schematic diagram illustrating the enlargement of the region G in FIG. 4 with points of different output lights of the first lighting units, and FIG. 6 is a schematic diagram illustrating the enlargement of the region R in FIG. 4 with points of different output lights of the second lighting units. Color gamut may be commonly represented by an area in the CIE 1931 chromaticity diagram of FIG. 4. The numbers marked along a curved edge CE may represent the wavelengths. In FIG. 4, the color of lights having x-y coordinates located in a region Y may be yellow or close to yellow.

In FIG. 5, a region CS can represent the color space of the lighting device 10, in which a point G0 may represent the green primary color, and points G1, G2, G3 correspond to the x-y coordinates of the first lights OL1 emitted by the first lighting units LU1 measured from some embodiments, but not limited thereto. The x-y coordinates of point G0, G1, G2, G3 may be as follows, G0$xy$=(0.17, 0.797), G1$xy$=(0.26, 0.705), G2$xy$=(0.27, 0.699), G3$xy$=(0.275, 0.698). Comparing the points G1, G2, G3 with the point G0, it can be confirmed that the color of the first light OL1 can be adjusted toward the region Y, and the first light OL1 emitted by the first lighting units LU1 can be yellower because the reduction of the intensity of blue light in the first light OL1. In some embodiments, reduction of the intensity of blue light in the first light OL1 may be caused by the introduction of the light absorbing material LA. The x-y coordinate of the first light OL1 in some embodiments can be located in the region G of the chromaticity diagram. For example, a green x-coordinate value in a CIE 1931 color gamut of the lighting device 10 is in a range from 0.17 to 0.29 ($0.17 \leq x \leq 0.29$), and a green y-coordinate value in the CIE 1931 color gamut of the lighting device 10 is in a range from 0.675 to 0.797 ($0.675 \leq y \leq 0.797$).

As shown in FIG. 6, a point R0 may represent the red primary color of the color space of the lighting device 10, and points R1, R2, R3, R4 correspond to the x-y coordinates of the second lights OL2 emitted by the second lighting units LU2 measured from some embodiments. The x-y coordinates of point R0, R1, R2, R3, R4 may be as follows, R0$xy$=(0.708, 0.292), R1$xy$=(0.693, 0.303), R2$xy$=(0.6915, 0.3035), R3$xy$=(0.687, 0.3045), R4$xy$=(0.684, 0.3082). Comparing the points R1, R2, R3, R4 with the point R0, it can be confirmed that the color of the second light OL2 can be adjusted toward the region Y, and the second light OL2 emitted by the second lighting units LU2 can be yellower because the reduction of the intensity of blue light in the second light OL2. In some embodiments, reduction of the intensity of blue light in the second light OL2 may be caused by the introduction of the light absorbing material LA. The x-y coordinate of the second light OL2 in some embodiments can be located in the region R of the chromaticity diagram. For example, a red x-coordinate value in the CIE 1931 color gamut of the lighting device 10 is in a range from 0.68 to 0.708 ($0.68 \leq x \leq 0.708$), and a red y-coordinate value in the CIE 1931 color gamut of the lighting device 10 is in a range from 0.292 to 0.31 ($0.292 \leq y \leq 0.31$).

Since the blue light (i.e. the sub-wave SW in the light spectrum LS) in the first light OL1 and the second light OL2 may be reduced, or the light mixed by the first light OL1 and/or the second light OL2 shifting toward blue region may be reduced. Therefore, the light having the color of yellow or close to yellow can be obtained or provided by the lighting device 10. In some embodiments, the yellow lighting units may not be required to be disposed in the lighting device 10. When the color space of the lighting device 10 is adjusted (e.g. by reducing the blue light), the visual perception of the observer may be improved.

The spectrums may be measured by the spectroradiometer. The spectroradiometer may be disposed at a side of the emitting surface of the intact lighting device 10 that is far from the backlight module BL or light emitting elements while measuring. The lighting device 10 may be set up to turn on at least one of the first lighting units LU1 (or at least one of the second lighting units LU2), and the lighting device 10 may emit the first light OL1 (or the second light OL2). The first lighting unit(s) LU1 or the second lighting unit(s) LU2 may be operated in the condition of maximum gray level while measuring. The spectroradiometer may include CA-210, CS 1000T, CS 2000 or other suitable instrument, but not limited thereto.

The technical features in different embodiments described in this disclosure can be replaced, recombined, or mixed. For making it easier to compare the difference between these embodiments, the following description will detail the dissimilarities among different embodiments and the identical features will not be redundantly described.

Figure 7:
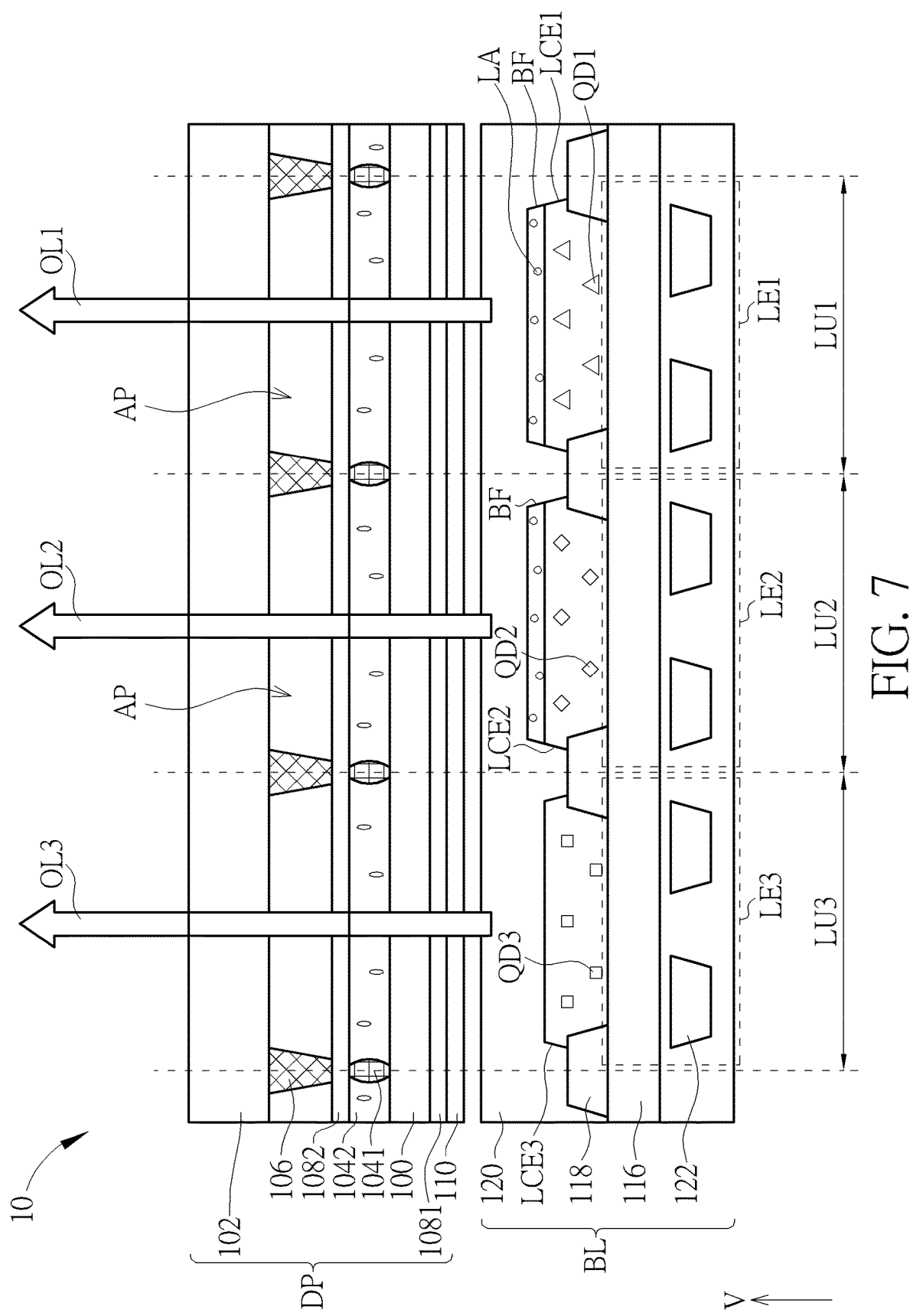
FIG. 7 is a schematic diagram illustrating a cross-sectional view of a lighting device according to a second embodiment.

Referring to FIG. 7, it is a schematic diagram illustrating a cross-sectional view of a lighting device according to a second embodiment. Different from the first embodiment, the light converting elements (such as LCE1, LCE2, and LCE3) can be disposed in the backlight module BL. In some embodiments, the light converting elements (such as LCE1, LCE2, and LCE3) can be disposed between an optical layer 116 and panel DP. In some embodiments, the light converting elements can be disposed on an optical layer 116 and separated by an isolation structure 118 to form an optical structure, which may be so-called as the "quantum-dot color-filter on light guide" structure. The light converting elements can be covered by a planarization layer 120, but not limited thereto. The optical layer 116 may include the light guide plate, diffuser plate or other optical films (or plates). The material of the isolation structure 118 and the material of the planarization layer 120 may include transparent materials, insulating materials, other suitable materials or the combination thereof, but not limited thereto. In FIG. 7, the backlight module BL may be a direct-lit type backlight module or an edge-lit type backlight module. In one embodiment, the backlight module BL is a direct-lit type backlight module, and the backlight module BL may include a plurality of light sources 122 disposed under the optical layer 116.

In some embodiments, a plurality of blocking structures BF may be respectively disposed on the first light converting element LCE1 and the second light converting element LCE2, and the light absorbing materials LA can be disposed in the blocking structures BF, as shown in FIG. 7. In some embodiments, the light absorbing materials LA may be disposed on the light emitting elements (such as LE1 and LE2) and/or the light converting elements (such as LCE1 and LCE2). In some embodiment, the blocking structures BF may be contacted to the top surfaces (or other surfaces) of the first light converting element LCE1 and/or the second light converting element LCE2, but not limited thereto. In some embodiments, the blocking structures BF may include yellow color filters, but not limited thereto. It should be noted that the blocking structures BF may include a main material and at least one of the blocking materials (or the light absorbing material LA) disposed in the main material, but not limited thereto. The main material of the blocking structures BF may include transparent materials, insulating materials, other suitable materials or the combination thereof, but not limited thereto. The blocking materials may block or filter the blue light, but not limited thereto. The blocking materials and the light absorbing material LA may be similar, and the description will not be repeated. In some embodiments, the blocking structures BF can be disposed in the apertures AP of the shielding structure 106 in the first lighting unit LU1 and/or the second lighting unit LU2, but not limited thereto.

In some embodiments, a portion of the light sources 122 and a portion of the optical layer 116 in FIG. 7 corresponding to the first light converting element LCE1 in the normal direction V may be regarded as the first light emitting element LE1. Additionally, the second light emitting element LE2 and the third light emitting element LE3 may also be defined by the above method. In some embodiments, the third light converting element LCE3 can include quantum dots QD3, the quantum dots QD3 can be excited by a portion of the input light emitting from the third light emitting element LE3, and the portion of the input light may be converted into blue light having different wavelength of main peak by the quantum dots QD3.

Figure 8:
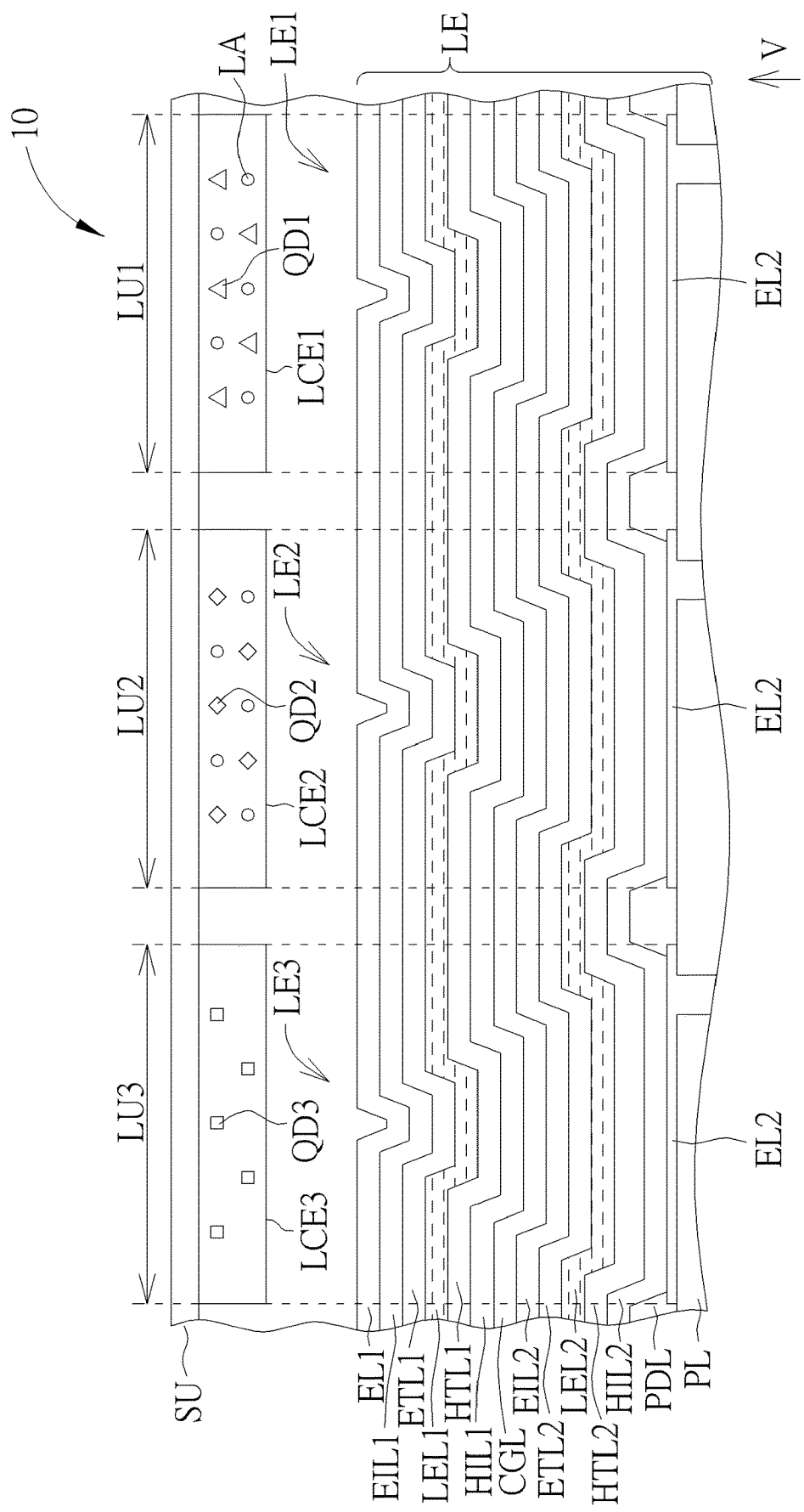
FIG. 8 is a schematic diagram illustrating a cross-sectional view of a lighting device according to a third embodiment.

Referring to FIG. 8, it is a schematic diagram illustrating a cross-sectional view of a lighting device according to a third embodiment. In some embodiments, the lighting device 10 may include organic light emitting diodes (OLED). The light emitting elements (such as LE1, LE2, and LE3) share a light emitting element LE, but not limited thereto. The common light emitting element LE may include at least one light emitting structure. For example, as shown in FIG. 8, the light emitting element LE includes a plurality of second electrodes EL2, a hole injection layer HIL2, a hole transport layer HTL2, a light emitting structure LEL2, an electron transport layer ETL2, an electron injection layer EIL2, a charge generating layer CGL, a hole injection layer HIL1, a hole transport layer HTL1, a light emitting structure LEL1, an electron transport layer ETL1, an electron injection layer EIL1, a first electrode EL1 sequentially stacked on a TFT substrate in the normal direction V, but not limited thereto.

The light emitting structure LEL1 and the light emitting structure LEL2 may include organic light emitting material or quantum dots, other suitable materials or the combination thereof, but not limited thereto. The second electrodes EL2 may be one of cathode and anode, and the first electrode EL1 may be another one of cathode and anode. The second electrodes EL2 are separately disposed in the corresponding the lighting units. The second electrodes EL2 may be disposed on a passivation layer PL, and a pixel definition layer PDL may be disposed on the second electrodes EL2. One of the apertures of the pixel definition layer PDL may correspond to one of the second electrodes EL2, and the second electrodes EL2 may be partially exposed through the apertures of the pixel definition layer PDL. One of the second electrodes EL2 may penetrate through the passivation layer PL to be electrically connected to a transistor of the lighting unit. In some embodiments, the light emitting structure LEL1, LEL2 may correspond to the lighting units LU1, LU2, and LU3, but not limited thereto. In some embodiments, other components may be disposed between the light emitting structures LEL1, LEL2. In some embodiments, the material of the light emitting structures LEL1, LEL2 may be the same or different. In addition, the first light converting element LCE1, the second light converting element LCE2, and the third light converting element LCE3 may be disposed on a substrate SU, and the substrate SU may be disposed opposite to the array substrate (not shown), but not limited thereto. In some embodiments, the first light converting element LCE1, the second light converting element LCE2, and the third light converting element LCE3 may be disposed or formed on the same substrate with the light emitting element LE and disposed on the light emitting element LE, and the substrate SU may be a protective layer or a protective film, but it is not limited thereto. In some embodiments, the above layers (or elements) may be added or removed depending on the situation, and are not limited thereto.

In addition, the stack structure of the light emitting element LE may be regarded as an integration of various light emitting components, wherein the light emitting components may be electrically connected in series. In some embodiments, the light emitting components may be disposed side by side laterally, the charge generating layer may not be disposed in the light emitting component, and the emitting components may be electrically connected in parallel.

In some embodiment, one of the lighting units (such as LU1, LU2, or LU3) may include at least one light source disposed in the light emitting element (such as LE1, LE2, or LE3). The light sources may include LED, micro-LED, mini LED, quantum dots LEDs (QLEDs or QD-LEDs), but not limited thereto. In some embodiments, one of the light converting elements (such as LCE1, LCE2, or LCE3) may be disposed on a top surface of the corresponding light sources. In some embodiments, one of the light converting elements (such as LCE1, LCE2, or LCE3) may disposed on (or cover) the top surface and the sidewalls of the corresponding light sources.

In summary, according to the light spectrums of the first light and the second light emitted by the lighting device, since the blue light (i.e. the sub-waves in the light spectrums) in the first light and the second light is reduced, the phenomenon of the light mixed by the first light and the second light shifting toward blue light region can be reduced. Therefore, the light having the color of yellow or close to yellow can be obtained or provided by the lighting device when the first light and the second light are used for mixing colors, and additional yellow lighting units may not be required to be disposed in the lighting device. When the color space of the lighting device is adjusted or shrank (e.g. by reducing the blue light for eye-protection concerns), the yellow region of the color space can still be retained, and it is also beneficial to the visual perception of the user.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A lighting device, comprising:
    a lighting unit emitting a light spectrum having a main peak between 520 nm and 780 nm and a sub peak corresponding to a first wavelength between 400 nm and 470 nm,
    wherein a second sub peak integral of the light spectrum is greater than a first sub peak integral of the light spectrum,
    wherein the first sub peak integral is an integral of the light spectrum calculated from a wavelength of the first wavelength minus 20 nm to the first wavelength,
    wherein the second sub peak integral is an integral of the light spectrum calculated from the first wavelength to a wavelength of the first wavelength plus 20 nm,
    wherein a ratio of the first sub peak integral to the second sub peak integral is in a range from 20% to 98%.

2. The lighting device of claim 1, wherein a ratio of the first sub peak integral to an intensity integral of a main wave comprising the main peak is in a range from 0.05% to 2%, and the intensity integral of the main wave is calculated from 521 nm to 780 nm.

3. The lighting device of claim 1, wherein a ratio of the second sub peak integral to an intensity integral of a main wave comprising the main peak is in a range from 0.05% to 10%, and the intensity integral of the main wave is calculated from 521 nm to 780 nm.

4. The lighting device of claim 1, wherein a red x-coordinate value in a CIE 1931 color gamut of the lighting device is in a range from 0.68 to 0.708.

5. The lighting device of claim 1, wherein a red y-coordinate value in a CIE 1931 color gamut of the lighting device is in a range from 0.292 to 0.31.

6. The lighting device of claim 1, wherein a green x-coordinate value in a CIE 1931 color gamut of the lighting device is in a range from 0.17 to 0.29.

7. The lighting device of claim 1, wherein a green y-coordinate value in a CIE 1931 color gamut of the lighting device is in a range from 0.675 to 0.797.

8. The lighting device of claim 1, wherein a ratio of a third sub peak integral of the light spectrum to a fourth sub peak integral of the light spectrum is in a range from 4% to 30%,
wherein the sub peak corresponds to a first intensity, a second intensity of a half of the first intensity in the light spectrum corresponds to a second wavelength and a third wavelength, and the second wavelength is less than the third wavelength,
wherein the third sub peak integral is an integral of the light spectrum calculated from a fourth wavelength to the second wavelength, and the fourth wavelength is the second wavelength minus 20 nm,
wherein the fourth sub peak integral is an integral of the light spectrum calculated from the third wavelength to a fifth wavelength, and the fifth wavelength is the third wavelength plus 20 nm.

9. The lighting device of claim 1, wherein the lighting unit comprises a light emitting element and a light converting element disposed on the light emitting element.

10. The lighting device of claim 9, wherein the light emitting element comprises at least one light emitting structure.

11. The lighting device of claim 9, further comprising a light modulating layer disposed between the light emitting element and the light converting element.

12. The lighting device of claim 9, wherein the lighting unit further comprises a light absorbing material disposed in the light converting element.

13. The lighting device of claim 9, wherein the lighting unit further comprises a light absorbing material disposed on the light emitting element or the light converting element.

14. The lighting device of claim 9, wherein the lighting unit further comprises a blocking structure disposed on the light converting element.

15. The lighting device of claim 1, wherein the lighting unit further comprises a light absorbing material, and the light absorbing material has higher absorbance corresponding to a light with shorter wavelength.

16. A lighting device, comprising:
a first lighting unit emitting a first light spectrum having a main peak between 525 nm and 585 nm and a first sub peak corresponding to a first wavelength between 400 nm and 470 nm; and
a second lighting unit emitting a second light spectrum having a main peak between 595 nm and 775 nm and a second sub peak corresponding to a second wavelength between 400 nm and 470 nm,
wherein an intensity of the first sub peak is different from an intensity of the second sub peak,
wherein an integral area of the first light spectrum partially overlaps an integral area of the second light spectrum.

17. The lighting device of claim 16, wherein a ratio of a first sub peak integral of the first light spectrum to a second sub peak integral of the first light spectrum is different from a ratio of a first sub peak integral of the second light spectrum to a second sub peak integral of the second light spectrum,
wherein the first sub peak integral of the first light spectrum is calculated from a wavelength of the first wavelength minus 20 nm to the first wavelength,
wherein the second sub peak integral of the first light spectrum is calculated from the first wavelength to a wavelength of the first wavelength plus 20 nm,
wherein the first sub peak integral of the second light spectrum is calculated from a wavelength of the second wavelength minus 20 nm to the second wavelength,
wherein the second sub peak integral of the second light spectrum is calculated from the second wavelength to a wavelength of the second wavelength plus 20 nm.

18. The lighting device of claim 16, wherein the first lighting unit comprises a first light emitting element and a first light converting element disposed on the first light emitting element, and the second lighting unit comprises a second light emitting element and a second light converting element disposed on the second light emitting element.

19. The lighting device of claim 16, wherein a ratio of a fifth sub peak integral of the first light spectrum to a sixth sub peak integral of the first light spectrum is different from a ratio of a fifth sub peak integral of the second light spectrum to a sixth sub peak integral of the second light spectrum,
wherein the fifth sub peak integral of the first light spectrum is calculated from 380 nm to the first wavelength of the first sub peak,
wherein the sixth sub peak integral of the first light spectrum is calculated from the first wavelength of the first sub peak to 520 nm,
wherein the fifth sub peak integral of the second light spectrum is calculated from 380 nm to the second wavelength of the second sub peak,
wherein the sixth sub peak integral of the second light spectrum is calculated from the second wavelength of the second sub peak to 520 nm.

* * * * *